[12] United States Patent  
Kimura

(10) Patent No.: US 7,301,797 B2
(45) Date of Patent: Nov. 27, 2007

(54) METHOD OF OPERATING SEMICONDUCTOR INTEGRATED CIRCUIT INCLUDING SRAM BLOCK AND SEMICONDUCTOR INTEGRATED CIRCUIT INCLUDING SRAM BLOCK

(75) Inventor: Yoshitaka Kimura, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 60 days.

(21) Appl. No.: 11/086,751

(22) Filed: Mar. 23, 2005

(65) Prior Publication Data

US 2005/0213371 A1   Sep. 29, 2005

(30) Foreign Application Priority Data

Mar. 24, 2004   (JP)   ............................. 2004-087753

(51) Int. Cl.
  *G11C 11/00*   (2006.01)
(52) U.S. Cl. .................. 365/154; 365/185.07; 365/226
(58) Field of Classification Search ................ 365/154, 365/226, 188.08
  See application file for complete search history.

(56) References Cited

U.S. PATENT DOCUMENTS

| 5,956,269 A | * | 9/1999 | Ouyang et al. | ........ 365/185.08 |
| 5,986,932 A | * | 11/1999 | Ratnakumar et al. | .. 365/185.07 |
| 6,064,591 A | * | 5/2000 | Takeuchi et al. | ....... 365/185.03 |
| 6,768,669 B2 | * | 7/2004 | Schmidt et al. | ........ 365/185.07 |
| 2004/0150120 A1 | * | 8/2004 | Ito | .............................. 257/903 |

FOREIGN PATENT DOCUMENTS

JP    A-6-76582    3/1994

* cited by examiner

*Primary Examiner*—Hoai V. Ho
(74) *Attorney, Agent, or Firm*—Oliff & Berridge, PLC

(57) ABSTRACT

A method of operating a semiconductor integrated circuit including a SRAM block, in which non-volatile data is stored in the SRAM block, is disclosed. In an exemplary embodiment, the non-volatile data is stored by flowing a drain current in one of a pair of pull-down transistors constituting the SRAM cell while supplying a fixed potential to the sources of the pull-down transistors. A semiconductor integrated circuit including a SRAM block and a control circuit that controls the SRAM block to store non-volatile data is also disclosed.

15 Claims, 7 Drawing Sheets

METHOD OF OPERATING SEMICONDUCTOR INTEGRATED CIRCUIT INCLUDING SRAM BLOCK AND SEMICONDUCTOR INTEGRATED CIRCUIT INCLUDING SRAM BLOCK

This invention was first described in Japanese Patent Application No. 2004-087753, which is hereby incorporated by reference in its entirety.

BACKGROUND

This invention relates to methods of operating semiconductor integrated circuits including SRAM (static random access memory) blocks and to semiconductor integrated circuits including SRAM blocks. This invention further relates to control circuits to be integrated with the SRAM block.

In semiconductor integrated circuits, especially in logic semiconductor integrated circuits that execute various logical operations, SRAMs are often integrated for temporarily storing data. A SRAM can be manufactured with a standard CMOS logic process used for manufacturing logic semiconductor integrated circuits. Accordingly, integration of a SRAM in a logic semiconductor integrated circuit is easy, i.e., requires no additional manufacturing steps.

However, a SRAM is a volatile memory in which the data stored disappears when the power-supply is turned off. It is necessary to integrate a non-volatile memory separately from the SRAM when it is necessary to hold the data after the power-supply is turned off.

There are several types of non-volatile memories such as, for example, a fuse-type memory that can be re-written once, and an EEPROM that can be electronically re-written a multiple number of times. Moreover, Japanese Laid-open Patent HEI 6-76582 (Patent Document 1) proposes another type of non-volatile memory that utilizes a change in the threshold voltage of a field-effect transistor (FET). Specifically, in Patent Document 1, data is written by injecting hot-electrons into the FET by applying a writing voltage that is designed specifically to write the data in a non-volatile fashion.

Integration of EEPROMs in logic semiconductor integrated circuits requires manufacturing steps not included in the conventional CMOS process, such as formation of a floating gate or a ferroelectric film. Such additional steps increase the cost of manufacturing. Fuse-type memories, on the other hand, require a large area, and cannot store a large amount of data.

Moreover, although the development of a SRAM is usually completed when a new manufacturing process is released, a non-volatile memory is usually developed after the release of the manufacturing process, and the development often requires a long period of time. Accordingly, while it is possible to use a state-of-the-art manufacturing process for manufacturing semiconductor integrated circuits including SRAM blocks, the state-of-the-art process cannot be used for manufacturing semiconductor integrated circuits including non-volatile memories.

SUMMARY

In order to solve the above-mentioned problems, an exemplary object of this invention is to provide a method of operating a semiconductor integrated circuit having a SRAM block that includes storing non-volatile data in the SRAM block. Another exemplary object of this invention is to provide a semiconductor integrated circuit that includes a SRAM block and a control circuit that controls the SRAM block to store non-volatile data. Another exemplary object of this invention is to provide control circuits that control the SRAM block to store non-volatile data in the SRAM block, or to handle the non-volatile data stored in the SRAM block.

In order to solve the above-mentioned problems, various exemplary embodiments according to this invention provide a method of operating a semiconductor integrated circuit including a SRAM block. The SRAM block includes a plurality of flip-flop type SRAM cells each including a pair of output nodes and a pair of pull-down transistors that pull down respective output nodes, power supply lines for supplying power-supply potentials to the plurality of SRAM cells, and bit lines and word lines for writing volatile data into and reading the volatile data from the plurality of SRAM cells. The method includes storing non-volatile data in at least one of the plurality of SRAM cells by flowing a drain current in one of the pair of pull-down transistors of the at least one of the plurality of SRAM cells, and stopping and re-starting to supply the power-supply potentials to the plurality of SRAM cells, and then reading the non-volatile data stored in the at least one of the SRAM cells.

That is, in various exemplary embodiments according to this invention, non-volatile data is stored in a SRAM block, which is generally integrated in a semiconductor integrated circuit for storing volatile data.

It is known that, when a drain current flows in a transistor, especially in an n-channel transistor that is typically used as a pull-down transistor in an SRAM cell, the conductance of the transistor gradually changes due to the hot-carrier degradation phenomenon. This invention utilizes this phenomenon. That is, by flowing a drain current in a pull-down transistor until the conductance of the transistor substantially changes, non-volatile data is stored in a SRAM cell.

Patent document 1 discloses a technique that also utilizes the change of conductance due to the hot-carrier degradation. However, the technique disclosed in Patent Document 1 requires a circuit construction different from that of a SRAM. In other words, Patent Document 1 does not teach storing non-volatile data in a SRAM.

According to various exemplary embodiments, the flowing of the drain current in the one of the pair of pull-down transistors may be performed while supplying a fixed potential to sources of the pair of pull-down transistors.

Usually, sources of the pair of pull-down transistors that constitute a SRAM cell are connected to a fixed potential, such as the ground potential. The exemplary embodiments of methods of operating semiconductor integrated circuits can use such SRAM cells in which the sources of the pull-down transistors are connected to a fixed potential. In other words, the exemplary embodiments of methods of operating semiconductor integrated circuits can utilize standard SRAMs.

According to various exemplary embodiments, the method of operating a semiconductor integrated circuit may further includes, after the reading of the non-volatile data, writing the read data into at least another one of the plurality of SRAM cells.

Reading the non-volatile data and writing, or copying, the read non-volatile data in different SRAM cells enables to use the non-volatile data by accessing the different SRAM cells in which the data is copied. Thereby, a repeated reading of the non-volatile data from the SRAM cell in which the non-volatile data is stored, which may degrade the integrity of the stored non-volatile data, can be avoided. Accordingly, the integrity of the non-volatile data can be maintained.

In order to solve the above-mentioned problems, various exemplary embodiments according to this invention provide a method of operating a semiconductor integrated circuit including a SRAM block. The method includes storing non-volatile data in at least one of the plurality of SRAM cells, and stopping and re-starting to supply the power-supply potentials to the plurality of SRAM cells, and then reading the non-volatile data stored in the at least one of the SRAM cells. Storing non-volatile data includes writing volatile data, which is logically inverted from the non-volatile data to be stored, in the at least one of the SRAM cells, and repeatedly reading the written data from the at least one of the SRAM cells.

The method of operating a semiconductor integrated circuit according to various exemplary embodiments only requires operations used in a standard SRAM. Therefore, the method does not require any unconventional circuit.

In order to solve the above-mentioned problems, various exemplary embodiments according to this invention provide a semiconductor integrated circuit including a SRAM block and a non-volatile data storage control circuit. According to various exemplary embodiments, the non-volatile data storage control circuit controls the SRAM block to store non-volatile data in at least one of the SRAM cells by flowing a drain current in one of the pair of pull-down transistors of the at least one of the SRAM cells.

By incorporating a non-volatile data storage control circuit in addition to a SRAM block in a semiconductor integrated circuit, control signals for storing the non-volatile data in the SRAM cells can be generated within the integrated circuit. Thereby, the non-volatile data can be stored in the SRAM block without a need for supplying complex control signal from outside the integrated circuit.

In various exemplary embodiments according to this invention, the semiconductor integrated circuit may further include a non-volatile data copying control circuit that detects a start of supplying the power-supply potentials to the SRAM cells, controls the SRAM block to read the non-volatile data stored in the at least one of the SRAM cells and to write the read data into at least another one of the plurality of SRAM cells.

By incorporating a non-volatile data copying control circuit in a semiconductor integrated circuit, control signals for reading the non-volatile data and for writing the read data can be generated within the integrated circuit. Thereby, the non-volatile data can be copied in different SRAM cells without a need for supplying complex control signal from outside the integrated circuit.

In order to solve the above-mentioned problems, various exemplary embodiments according to this invention provide a semiconductor integrated circuit including a SRAM block and a non-volatile data storage control circuit. The non-volatile data storage control circuit controls the SRAM block to store non-volatile data in at least one of the SRAM cells by writing volatile data, which is logically inverted from the non-volatile data to be stored, in the at least one of the SRAM cells, and repeatedly reading the written data from the at least one of the SRAM cells.

In order to solve the above-mentioned problems, various exemplary embodiments according to this invention provide a non-volatile data storage control circuit for integrating in a semiconductor integrated circuit including a SRAM block. The control circuit includes a controller that controls the SRAM block to store non-volatile data in at least one of the SRAM cells by writing volatile data, which is logically inverted from the non-volatile data to be stored, in the at least one of the SRAM cells, and by repeatedly reading the written data from the at least one of the SRAM cells, and a counter that counts a number of the repeated reading.

In order to solve the above-mentioned problems, various exemplary embodiments according to this invention provide a non-volatile data copying control circuit for integrating in a semiconductor integrated circuit including a SRAM block. The control circuit includes a detector that detects a start of supplying the power supply potentials to the SRAM cells, and a controller that controls the SRAM block to read the non-volatile data stored in the at least one of the SRAM cells and to write the read data into at least another one of the SRAM cells.

DETAILED DESCRIPTION OF EMBODIMENTS

Various exemplary embodiments according to this invention will be explained in detail below.

Figure 1:
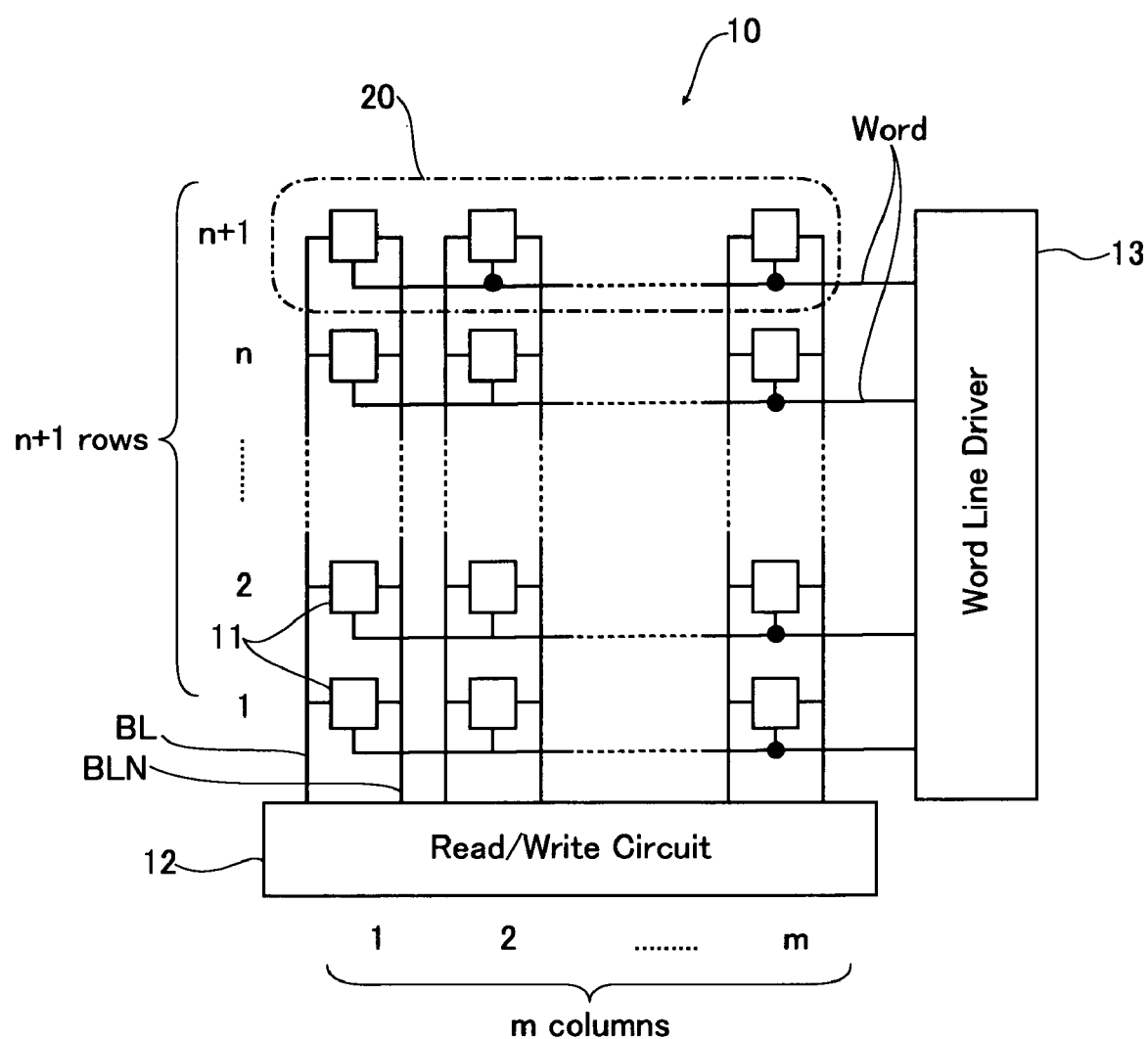
FIG. 1 is an exemplary schematic drawing of a SRAM block.

FIG. 1 is an exemplary schematic drawing of a SRAM block 10 according to various exemplary embodiments, in the SRAM block 10, n+1 rows and m columns of SRAM cells 11 are two-dimensionally arranged in the vertical and horizontal direction, respectively. The SRAM block 10 further includes a read/write circuit 12 and a word line driver 13. Pairs of bit lines BL and BLN extend in the vertical direction from the read/write circuit. Each of the pairs of bit lines are connected to the SRAM cells in their corresponding column. Word lines Word extend in the horizontal direction from the word line driver 13. Each of the word lines Word is connected to the SRAM cells 11 in their corresponding row.

Figure 2:
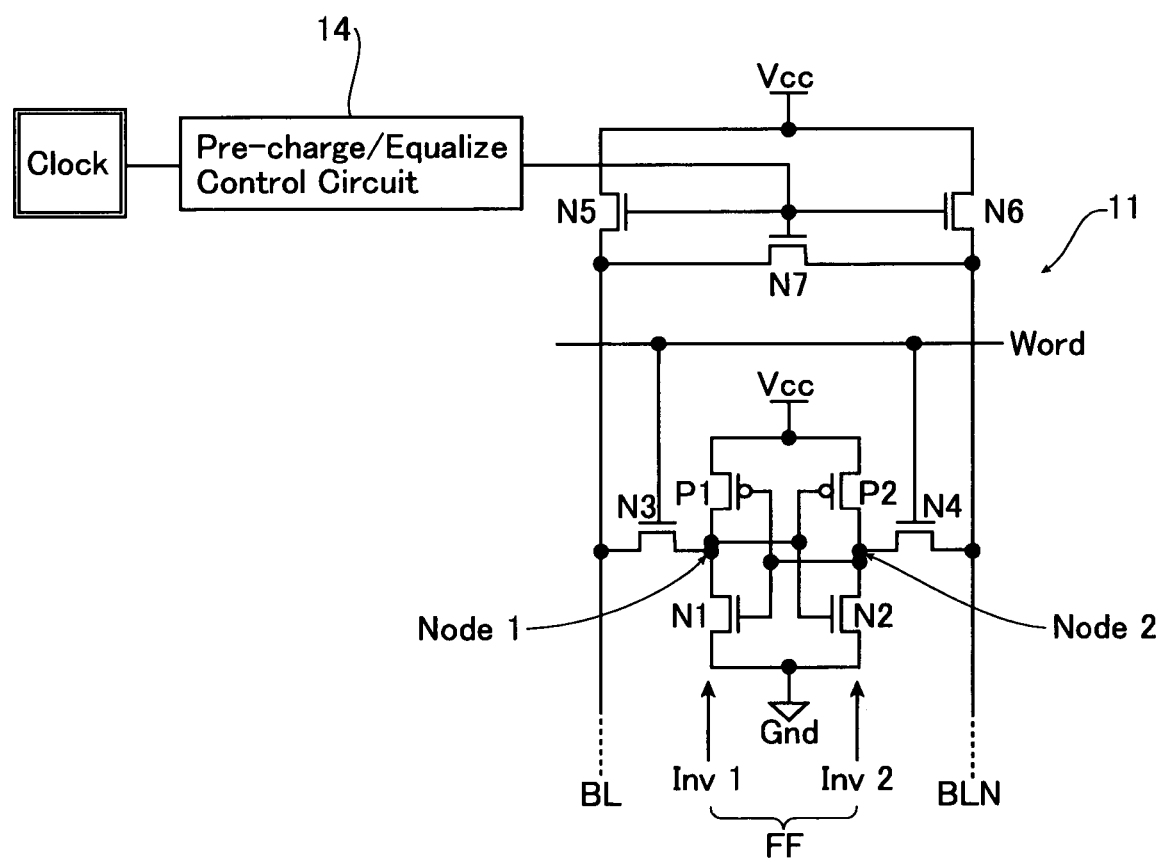
FIG. 2 shows an exemplary construction of each of the SRAM cells 11 shown in FIG. 1.

According to various exemplary embodiments, the SRAM block further includes power supply lines that supply power-supply potentials to each of the SRAM cells 11 (see FIG. 2).

In the example shown in FIG. 1, non-volatile data is written in a group of SRAM cells 20 in the (n+1)th row in the two-dimensionally arranged SRAM cells 11, which are connected to one of the word lines Word.

FIG. 2 shows an exemplary construction of each of the SRAM cells 11. It should be noted that the pre-charge/equalize control circuit 14 shown is a circuit block provided commonly for the entire SRAM block 10 shown in FIG. 1.

In the exemplary SRAM cell 11, a first inverter Inv 1 constructed with a first p-channel pull-up transistor P1 and a first n-channel pull-down transistor N1, and a second inverter Inv 2 constructed with a second p-channel pull-up transistor P2 and a second n-channel pull-down transistor N2, are connected between the Vcc power-supply line for supplying the Vcc potential and a Gnd power-supply line for supplying the ground potential. Outputs of these two inverters Inv 1 and Inv 2 are connected to the inputs of another one of the inverters, and thereby construct a flip-flop circuit FF.

According to various exemplary embodiments, a first n-channel pass transistor N3 is connected between the output of the first inverter and the first bit line BL. The gate of the first pass transistor N3 is connected to the word line Word. A second n-channel pass transistor N4 is connected to the output of the second inverter and the second bit line BLN. The gate of the second pass transistor N4 is connected to the word line Word.

Furthermore, according to various exemplary embodiments, pre-charge transistors N5 and N6 are connected between the respective bit lines BL and BLN and the Vcc power-supply line. An n-channel equalize transistor N7 is connected between the bit lines BL and BLN. These pre-charge transistors N5 and N6 and the equalize transistor N7 are included in the read/write circuit 12 in the schematic drawing shown in FIG. 1.

The gates of these pre-charge transistors N5 and N6 and the equalize transistor N7 are coupled and connected to the output of the pre-charge/equalize control circuit 14. Moreover, a clock signal is input to the pre-charge/equalize control circuit 14. Thereby, the SRAM cell 11 operates synchronously with the clock signal.

According to various exemplary embodiments, the SRAM cell 11 is the type that is used as a standard component in logic semiconductor integrated circuits. All the transistors N1 through N4 and P1 and P2 are standard MOS transistors manufactured with the same manufacturing process used for manufacturing transistors in various logic circuitry integrated in the semiconductor integrated circuit. In other words, none of the transistors in the SRAM cell 11 is an unconventional transistor used for constructing non-volatile memories such as a floating gate transistor and a transistor with a ferroelectric gate dielectric film.

According to various exemplary embodiments, the gate dielectric film of the transistors constructing the SRAM cell 11 is preferably formed simultaneously with the gate dielectric film of the transistors in the logic circuitry integrated in the semiconductor integrated circuit. In such a case, the gate dielectric films of the transistors constructing the SRAM cell 11 and that of the transistors constructing the logic circuitry have a same compositions and thickness.

According to various exemplary embodiments, the SRAM cell 11 stores one bit of data. When storing one bit of volatile data in the SRAM cell 11, Vcc and Gnd power-supply potentials are supplied from the power-supply lines, and signals mutually inverted with each other are output to the pair of bit lines BL and BLN from the read/write circuit 12 (see FIG. 1). For example, a logical Low signal is output to the first bit line BL and a logical High signal is output to the second bit line BLN. Furthermore, the word line Word is set to the High level.

As a result, the pass transistors N3 and N4 become conductive and the data on the first bit line BL (Low) is written in the node 1 and the data on the second bit line BLN (High) is written in the node 2. The flip-flop FF holds these data while the power is supplied. Thereafter, the word line Word moves to the Low level and the pass transistors N3 and N4 turn off. Thereby, the written data is stored in the SRAM cell 11. However, the data thus stored is volatile, i.e., disappears when the power-supply is turned off.

According to various exemplary embodiments, in order to read out the written data from the SRAM cell 11, a High level signal is supplied to the gates of the pre-charge transistors N5 and N6 and the equalize transistor N7 from the pre-charge/equalize control circuit 14. As a result, the pair of bit lines BL and BLN are pre-charged and equalized to the same potential. Thereafter, the gates of the pre-charge transistors N5 and N6 and the equalize transistor N7 move to the Low level. Thereby, the supply of the charges to the bit lines BL and BLN is stopped, and the bit lines BL and BLN are electrically insulated with each other.

According to various exemplary embodiments, Low data is stored in the node 1 and High data is stored in the node 2. Because a High level signal is input to the gate of the first pull-down transistor N1 from the node 2, the first pull-down transistor N1 is on. Because a Low level signal is input to the gate of the second pull-down transistor N2 from the node 1, on the other hand, the second pull-down transistor N2 is off. Subsequently, the word line Word moves to the High level, and the pass transistors N3 and N4 are turned on. As a result, the charges pre-charged in the first bit line BL flow to the Gnd power-supply line through the pass transistor N3 and first the pull-down transistor N1, and the potential of the bit line BL drops.

According to various exemplary embodiments, because the second pull-down transistor N2 is off, on the other hand, the charges in the second bit line BLN do not discharge even if the pass transistor N4 is turned on, and the potential of the second bit line BLN stays High. As a result, a difference in the potentials of the pair of bit lines BL and BLN develops. The read/write circuit 12 shown in FIG. 1 reads the data from the SRAM cell 11 depending on which of the potentials of the pair of bit lines BL and BLN decreases.

Thus far, standard operations of the SRAM block 10, i.e., writing and reading of volatile data, are explained. Next, storing and reading of non-volatile data in the SRAM block 10 will be explained below.

Figure 3:
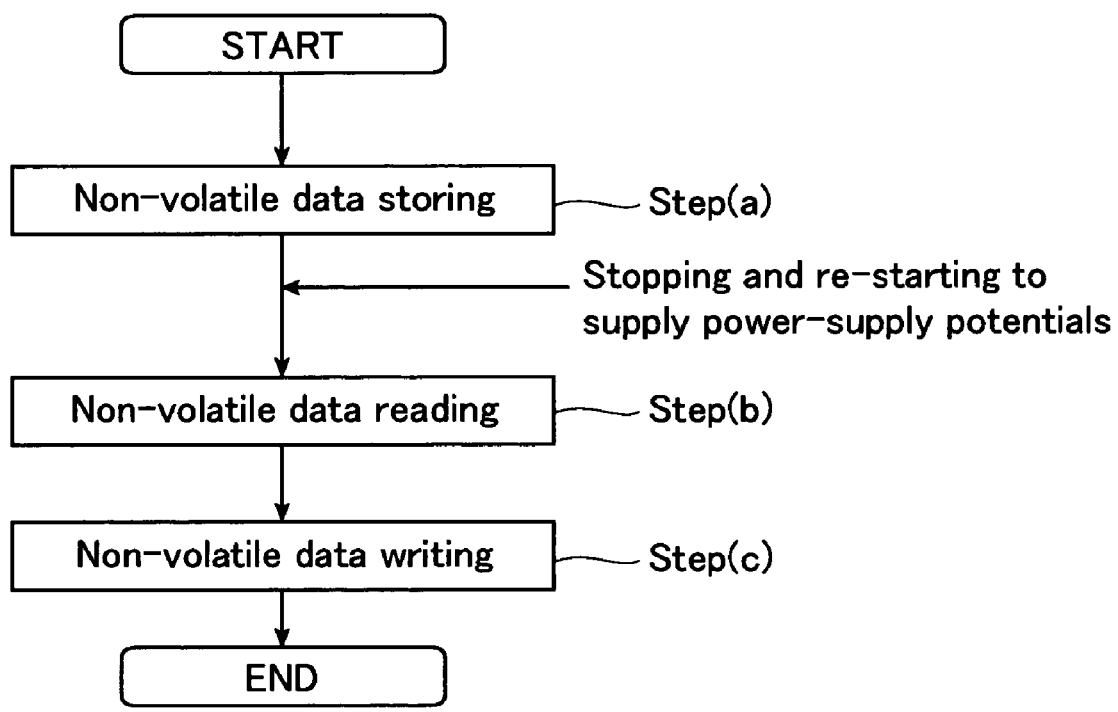
FIG. 3 is a flow chart showing an exemplary method of operating the semiconductor integrated circuit according to various exemplary embodiments of this invention.

FIG. 3 is a flow chart showing an exemplary method of operating the semiconductor integrated circuit according to this invention. According to various exemplary embodiments, the method shown in the flow chart includes a non-volatile data storing step (Step (a)), a non-volatile data reading step (Step (b)), and a non-volatile data writing step (Step (c)). After the completion of the non-volatile data storing step (Step (a)), the supply of the power-supply potentials stops (the power-supply turns off). Thereafter, the non-volatile data reading step (Step (b)) and the non-volatile data writing step (Step (c)) may be performed each time when the supply of the power-supply potential re-starts (the power-supply turns on).

In the non-volatile data storing Step (a), according to an exemplary embodiment, data (non-volatile data) is stored in the (n+1)th row of the SRAM cells 20 shown in FIG. 1 in a non-volatile fashion.

Figure 4:
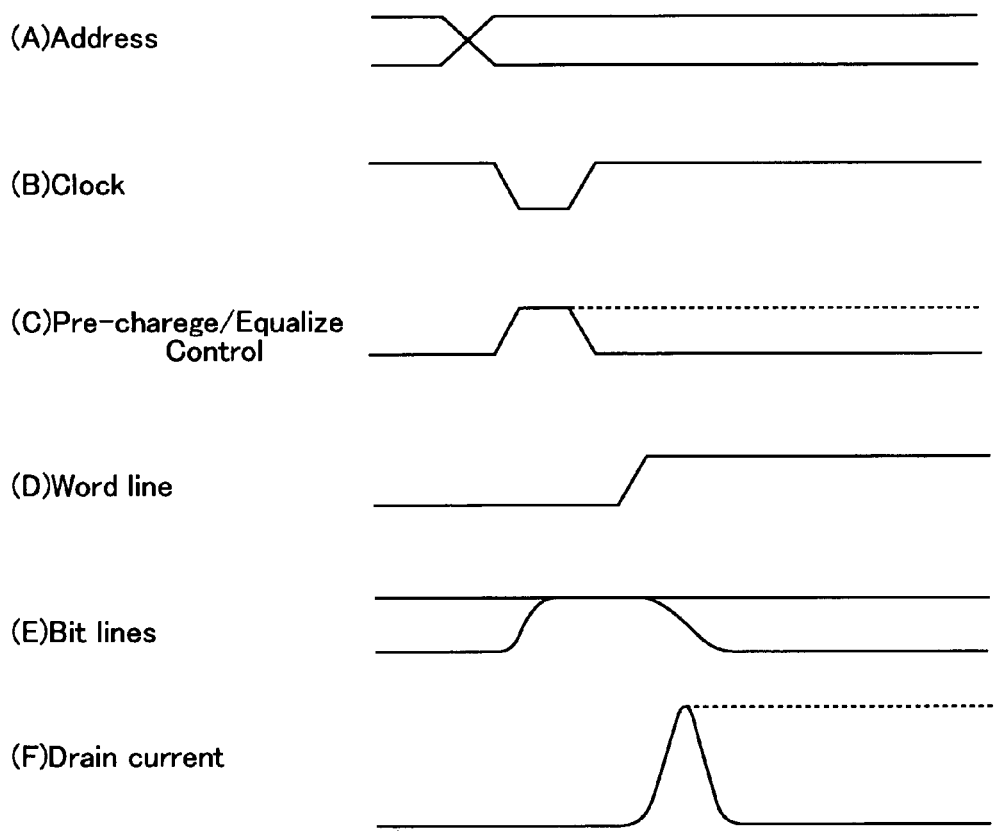
FIG. 4 is an exemplary timing chart showing signal waveforms during the storing of the non-volatile data in the SRAM cell 11 shown in FIG. 2.

FIG. 4 is an exemplary timing chart showing signal waveforms during the storing of the non-volatile data in the SRAM cell 11 shown in FIG. 2. In the following paragraphs, the non-volatile data storing Step (a) will be explained with references to FIGS. 2 and 4. The non-volatile data storing Step (a) includes volatile data writing and repeatedly reading the written data.

First, prior to the period shown in the timing chart of FIG. 4, Vcc and Gnd power-supply potentials are supplied from the power-supply lines, and a volatile data, which is inverted from the non-volatile data to be stored, is written in the SRAM cell 11. For example, in order to store High nonvolatile data in the node 1 and Low non-volatile data in the node 2, Low data is written in the node 1 and High data is written in the node 2.

Next, as shown in FIG. 4, synchronous with the clock (B), a control signal (C) is supplied in order to turn on the pre-charge transistors N5 and N6 and equalize the transistor N7. Thereby, the pair of bit lines BL and BLN are pre-charged and equalized as show by the waveform (E). Then, after turning off the transistors N5, N6, and N7, one of the word lines Word designated by the address signal (A) moves from the Low state to the High state, as shown by the waveform (D). As a result, the charges pre-charged from the Vcc power-supply to the first bit line BL flow through the transistors N3 and N1 to the Gnd power-supply, as shown by the waveform (E), and a transient drain current flows in the first pull-down transistor N1, as shown by the waveform (F).

Next, the operation shown in FIG. 4 is repeated. That is, i) move the word line Word from the High state to the Low state and pre-charge and equalize the bit lines BL and BLN, and ii) move the word line Word from the Low state to the High state and flow the transient drain current in the first pull-down transistor N1. Repeating this sequence multiple times changes, or decreases, the conductance of the first pull-down transistor N1 due to the hot-carrier degradation.

Accordingly, a difference in the conductance between the pair of pull-down transistors, in which the conductance of the first pull-down transistor N1 is lower than the conductance of the second pull-down transistor N2, is produced. As a result, the nodes 1 and 2 are always in High and Low states, respectively, when the power-supply is turned off and then is turned on again. That is, a non-volatile data is stored in the SRAM cell 11.

According to various exemplary embodiments, the pair of N-channel pull-down transistors N1 and N2 constituting the flip-flop FF in the SRAM cell 11 are formed with the same target dimension. These N-channel pull-down transistors have approximately the same conductance before performing the operation for changing the conductance described by the above method. Accordingly, the logical state of the SRAM cell 11 is determined randomly during the turning on of the power supply. That is, the logical state of the SRAM cell 11 is determined depending on a mismatch in the conductance between the pair of pull-down transistors, which is produced by the random variation of the conductance.

However, repeating the sequence shown in FIG. 4 a number of times sufficient to change the conductance of one of the N-channel pull-down transistors in an amount larger than the range of the mismatch enables to store the non-volatile data. That is, repeating the sequence shown in FIG. 4 produces a situation where the conductance of one of the pull-down transistors, in which the drain current flowed, is lower than the conductance of the other pull-down transistor, irrespective of the initial mismatch in the conductance. The difference in the conductance ensures the development of a fixed logical state in the SRAM cell 11 during the turning on of the power supply. Thus, a non-volatile data is stored in the SRAM cell 11.

It should be noted that, as explained above, the non-volatile data is stored in the SRAM cell 11 using write and read operations of volatile data, which are the standard operations of the SRAM block 10. Accordingly, in contrast to the method described in Patent Document 1, the non-volatile data can be stored in a standard SRAM without a need for adding a special circuitry that is not included in a standard SRAM block. More specifically, the operation shown in FIG. 4 can be performed keeping the sources of the pull-down transistors N1 and N2 fixed to the ground potential.

On the other hand, by modifying the operation of the pre-charge/equalize control circuit 14 shown in FIG. 2 and the operation of the word line driver 13 shown in FIG. 1, the nonvolatile data can be stored rapidly.

That is, according to a modified exemplary embodiment of the method of operation of a semiconductor integrated circuit, as shown by the broken line in the wave form (C), the word line Word may move from the Low state to the High state while keeping the transistors N5, N6, and N7 on. As a result, when a Low data and a High data are written in the nodes 1 and 2, respectively, for example, a current path from the Vcc power-supply to the Gnd power-supply through the transistors N5, N3, and N1 is formed. Accordingly, a continuous drain current flows in the first pull-down transistor N1. In a SRAM that is enable to perform such an operation, a non-volatile data can be stored rapidly.

In the exemplary SRAM block shown in FIGS. 1 and 2, n-channel transistors N5 and N6 are used to constitute the pre-charge transistors and an n-channel transistor N7 is used to constitutes the equalize transistor. However, it is also possible to use p-channel transistors to constitute the pre-charge and equalize transistors. Further, it is also possible to use a pair of an n-channel and a p-channel transistor, which are connected in parallel with each other, to constitute the equalize transistor.

Using p-channel transistors to constitute the pre-charge transistors enable to pre-charge the bit lines BL and BLN to a higher potential, or a potential equal to the Vcc power-supply potential, compared to the case that n-channel transistors are used. Accordingly, a higher drain current flows in the pull-down transistor compared to the case that n-channel transistors are used to constitute the pre-charge transistors. As a result, the non-volatile data can be stored within a shorter period of time.

Next, in the non-volatile data reading Step (b) shown in FIG. 3, after re-starting to supply the power-supply potentials, the non-volatile data stored in the SRAM cells through the operation described above are read. In an exemplary embodiment, the non-volatile data is read from the (n+1)th row of SRAM cells shown in FIG. 1. Furthermore, in the non-volatile data writing Step (c), the non-volatile data read in Step (b) are written in different SRAM cells. For example, the non-volatile data may be written in the n-th row of the SRAM cells. The reading of the non-volatile data in Step (b) and the writing of the read non-volatile data in Step (c) can be performed similarly to the reading and writing of volatile data described above.

According to various exemplary embodiments, in the Steps (b) and (c), the non-volatile data stored in SRAM cells is copied in different SRAM cells. Such copying of the non-volatile data is performed because of the following reason. In order to store a non-volatile data in an SRAM cell, a data logically inverted from the non-volatile data to be stored is written in the SRAM cell, and the written data is read repeatedly. Thereby, the conductance of one of the pair of pull-down transistors is changed and a difference in the conductance sufficient to store the non-volatile data is produced. If the stored non-volatile data is read multiple times directly from the SRAM cell in which the non-volatile data is stored, the conductance of another one of the pair of pull-down transistors changes. As a result, the difference in the conductance of the pair of pull-down transistors decreases, and the integrity of the non-volatile data degrades.

According to various exemplary embodiments, copying the non-volatile data in different SRAM cells enables to use the non-volatile data by accessing the SRAM cell in which the non-volatile data is copied. Thereby, the frequency of accessing the SRAM cells in which the non-volatile data is stored can be reduced. Accordingly, the integrity of the non-volatile data can be maintained.

It should be noted that, when the frequency of access is within a range where the integrity of the non-volatile data can be maintained, the non-volatile data writing Step (c) is not required. That is, the non-volatile data reading Step (b) is performed when the non-volatile data becomes necessary, and can be directly utilized without writing it in different SRAM cells. Moreover, when it becomes necessary to use the non-volatile data again, the non-volatile data can be read again directly from the SRAM cells in which the non-volatile data is stored.

For example, when using the non-volatile data as an ID that identifies the semiconductor integrated circuit die, the integrity of the non-volatile data can be maintained even if the non-volatile data is directly read from the SRAM cells that store the non-volatile data. In such an application, the non-volatile data is required only for the purpose of the failure analysis, for example. Therefore, the frequency of access is low.

Figure 5:
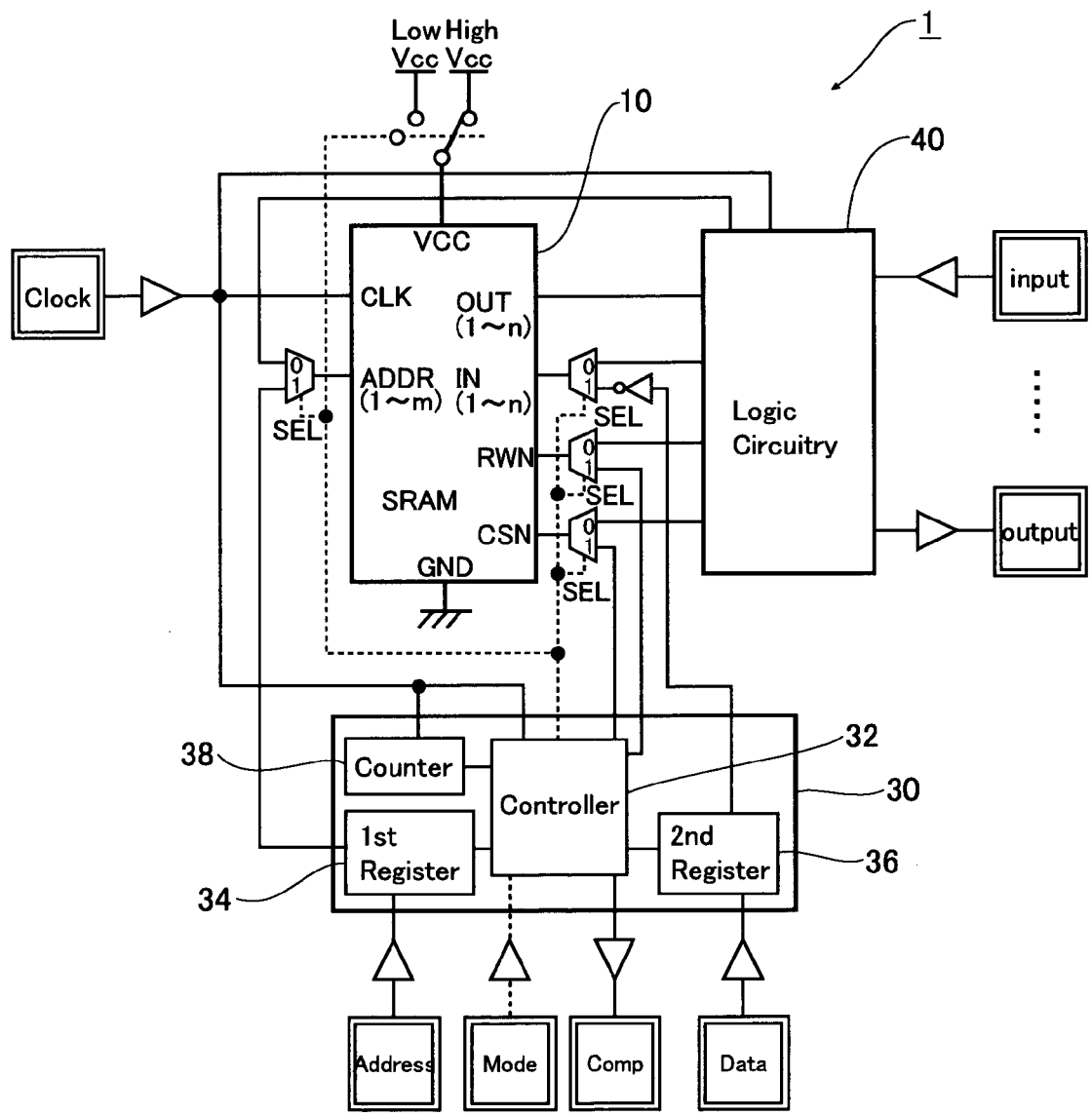
FIG. 5 is an exemplary schematic drawing of a semiconductor integrated circuit including an exemplary non-volatile data storage control circuit.
Figure 6:
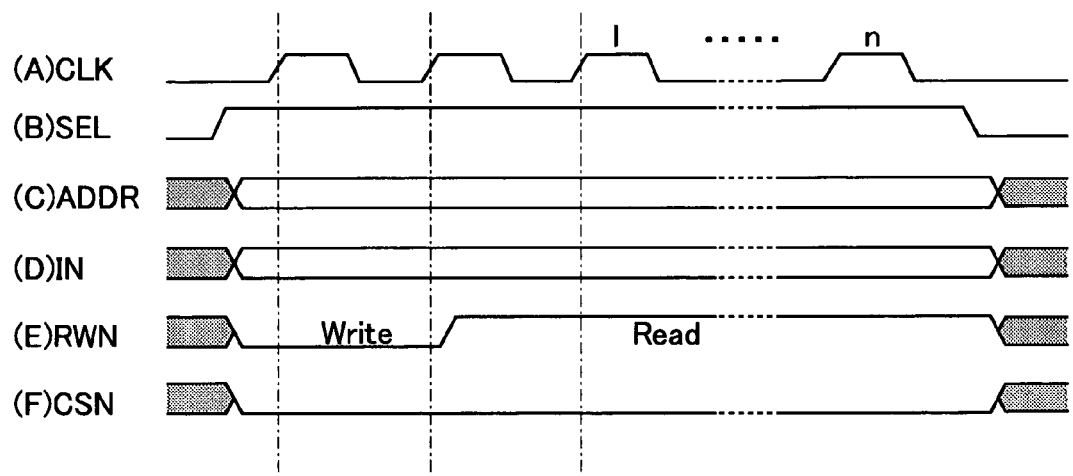
FIG. 6 is an exemplary timing chart that shows the operation sequence of the exemplary non-volatile data storage control circuit 30 shown in FIG. 5.

FIG. 5 is an exemplary schematic drawing of a semiconductor integrated circuit including an exemplary non-volatile data storage control circuit 30 according to this invention that controls the storage of non-volatile data in the SRAM block 10. The non-volatile data storage control circuit 30 utilizes a high power-supply voltage High Vcc, which is relatively higher than the power-supply voltage Vcc. FIG. 6 is an exemplary timing chart that shows the operation sequence of the exemplary non-volatile data storage control circuit 30 shown in FIG. 5.

The SRAM block 10 integrated in the exemplary semiconductor integrated circuit 1 includes a clock terminal (CLK), m bits address terminal (ADDR), n bits data output terminal (OUT), n bits data input terminal (IN), a read/write select terminal (RWN), and a chip select terminal (CSN). Note that the use of the same reference character (m) does not indicate that the number of bits of the address terminal ADDR is the same as the number of columns of the SRAM cells 11 shown in FIG. 1. Similarly, the use of the same reference character (n) does not indicate that the number of bits of the data input and data output terminals IN and OUT is the sane as the number of rows of the SRAM cells 11 shown in FIG. 1.

Under the control of the exemplary non-volatile data storage control circuit 30 shown in FIG. 5, non-volatile data is stored in the SRAM block 10 by the following sequence:

(1) The data to be stored and the addresses of the SRAM cells in which the non-volatile data is stored are input to the data Input (Data) and the address input (Address) terminals;

(2) When a switching signal is input to the mode select terminal (Mode), the controller 32 performs the following operations:

a) Store the address in the first register 34, store the data in the second register 36, and reset the counter 38;

b) Input High signal to the select terminals (SEL) of the multiplexers placed before the input terminals of the SRAM block 10 in order to select the signals from the non-volatile data storage control circuit 30, as shown by the waveform (B) in FIG. 6;

c) Input Low signal to the chip select terminal (CSN) in order to make each inputs of the SRAM block 10 active, as show by the waveform (F);

d) Input Low signal to the read/write select terminal (RWN) in order to make the SRAM block 10 change to the write mode, as shown by the waveform (E);

e) If the High Vcc can be supplied, switch the Vcc of the SRAM block 10 to the High side;

(3) A clock signal is supplied to the clock terminal (CLK) of the SRAM block 10 as shown by the waveform (A). Synchronous with the first rising edge of the clock signal, data opposite to the data input to the data input terminal (Data) of the control circuit 30 is written as a volatile data in the specified address of the SRAM cells, as shown by the waveform (C);

(4) Synchronous with the second rising edge of the clock signal, High signal is input to the read/write select terminal (RWN) in order to switch the SRAM block 10 to the read mode as shown by the waveform (E);

(5) Synchronous with the third rising edge of the clock signal, the data written in the step (3) is read. Thereafter, the same reading operation is repeated;

(6) The counter 38 counts the number of clocks. When the number reaches a value n, which is necessary to store the non-volatile data, the controller 32 inputs Low signals to the select terminals (SEL) of the multiplexers in order to select the signals from the logic circuitry 40, as shown by the waveform (B). Thereafter, the controller 32 output a completion signal to the completion signal output terminal (Comp);

(7) If it is necessary to store the data in other addresses, repeat the operations of the steps (1) through (6); and (8) After storing the non-volatile data to all of the addresses to be stored, a switching signal is input to the mode select terminal (Mode). As a result, the controller 32 switches the Vcc supplied to the SRAM block 10 to the Low side, so that the logic circuitry 40 can use the SRAM block 10.

For example, when the SRAM block 10 is formed using a 0.18 μm-node manufacturing process, the initial mismatch in the conductance between the pair of pull-down transistors in the same SRAM cell may be within a range of about 0.1%. Typically, the repeated flowing of the transient drain current for more than about 1,000,000 times change the conductance of one of the pair of pull-down transistors in an amount larger than the range of the initial mismatch, when the High Vcc of, for example, 2.7 V is supplied to the SRAM cell. Accordingly, when the repeated reading is performed in a frequency higher than about 100 MHz, the storing of the non-volatile data is completed within about 1 s.

An exemplary non-volatile data storage control circuit 30 that controls the SRAM block 10 to store the non-volatile data by repeatedly flowing transient drain current in one of the pull-down transistors is described. In order to realize high speed storing by flowing a continuous drain current into the pull-down transistor, on the other hand, after pre-charging the bit lines, the bit lines are kept in the High state, as explained referring to FIGS. 2 and 4. Except for this minor change of operation, a non-volatile data storage control circuit substantially the same as that shown in FIG. 5 can be used.

That is, for example, the counter 38 for counting the number of times that the transient drain current flowed may be replaced with a timer for measuring the time during which the continuous drain current flowed. Alternatively, the counter 38 may be used as a timer for measuring the time during which the continuous current flowed by counting the number of clock pulses. After flowing the continuous drain current for a required time period, the word line moves to the Low state.

Figure 7:
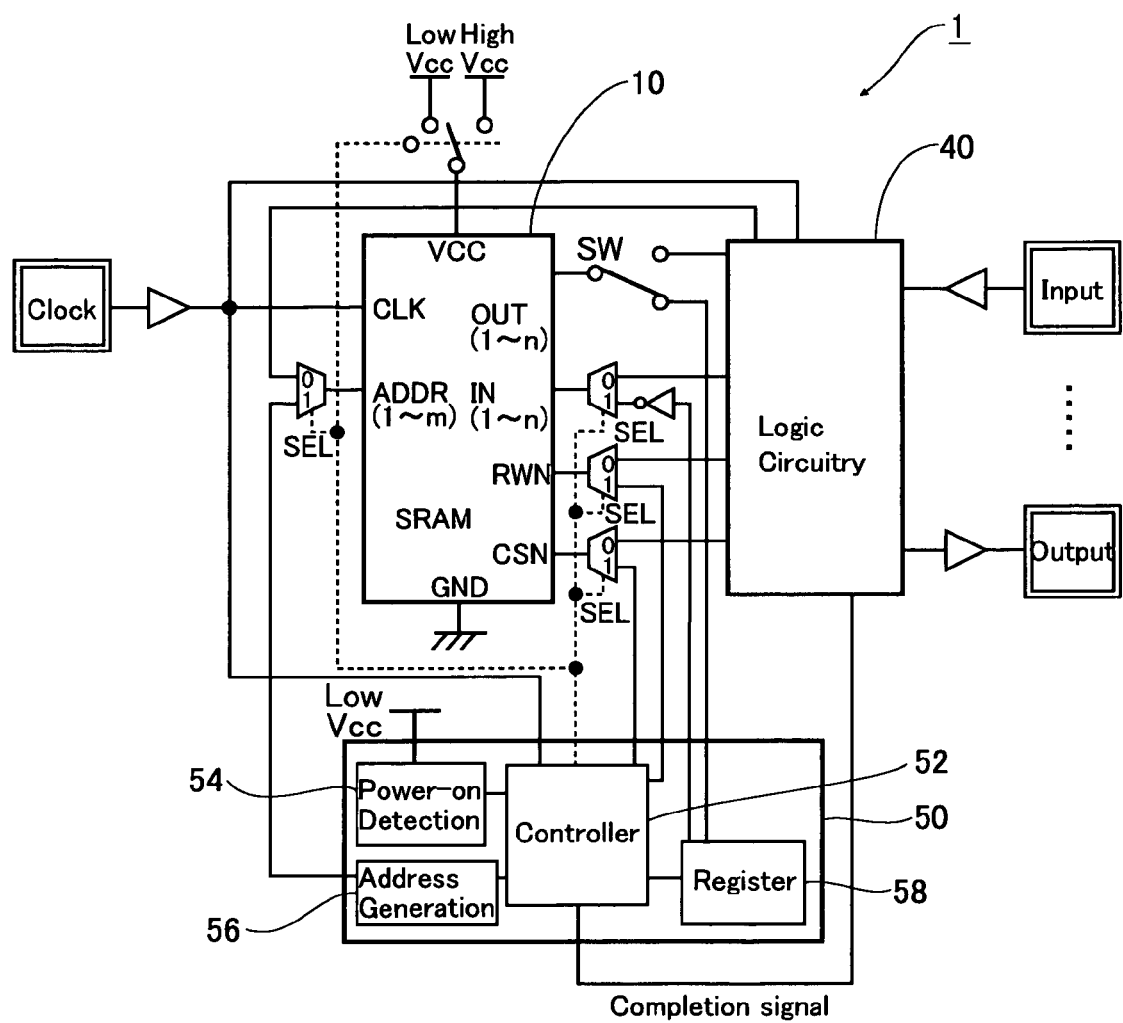
FIG. 7 is an exemplary schematic drawing of a semiconductor integrated circuit including an exemplary non-volatile data copying control circuit.

FIG. 7 is an exemplary schematic drawing of a semiconductor integrated circuit including an exemplary non-volatile data copying control circuit 50 according to this invention. The non-volatile data copying control circuit 50 controls the reading of the non-volatile data stored in the SRAM cells and the writing of the read data in different SRAM cells.

According to various exemplary embodiments, the non-volatile data stored in the SRAM cells are read and written in different SRAM cells using the following sequence:

(1) The power-on detection circuit 54 detects the rise of the Low Vcc voltage and after a predetermined time passes after detecting the rise, sends a mode switching signal to the controller 52;

(2) Upon receiving the switching signal, the controller 52 does following operations:
a) Sends a reset signal to the address generation circuit 56;
b) Connect the switch SW arranged at the output terminal of the SRAM block 10 to the side of the non-volatile data copying control circuit 50;
c) Input High signals to the select terminals (SEL) of the multiplexers arranged at the input terminals of the SRAM block 10, in order to select the signals from the control circuit 50;
d) Input Low signal to the chip select terminal (CSN) in order to activate each input of the SRAM block 10;

(3) Clock signal is input to the clock terminal (CLK) of the SRAM block 10 and to the controller 52. Then, synchronous with the first rising edge of the clock signal, the controller 52 sets the read/write select terminal (RWN) of the SRAM block 10 in the High state in order to set the SRAM block 10 in the read mode. Simultaneously, the controller 52 sends an address generation instruction signal to the address generation circuit 56. As a result, the address generation circuit 56 generates the first addresses of the SRAM cells in which the non-volatile data is stored, and inputs the generated addresses to the address terminal ADDR of the SRAM block 10. Accordingly, the non-volatile data is read from the designated addresses of the SRAM cells and is stored in the register 58;

(4) Synchronous with the second rising edge of the clock signal, the controller 52 sets the RWN terminal in the Low sate in order to switch the SRAM block 10 to the write mode;

(5) Synchronous with the third rising edge of the clock signal, the controller 52 sends the address generation instruction signal to the address generation circuit 56. As a result, the address generation circuit 56 generates the first addresses of the SRAM cells into which the non-volatile data read in the step (3) is written. Simultaneously, the non-volatile data stored in the register 58 in the step (3) is input to the input terminal (IN) of the SRAM block. As a result, the non-volatile data is written in the SRAM cells designated by the addresses;

(6) The operations described in steps (3) through (5) are repeated. Thereby, the non-volatile data is read from the SRAM cells in a predetermined range of addresses, and the read data is written in the SRAM cells in a different predetermined range of addresses; and (7) When step (6) is completed, the controller 52 connects the switch SW arranged at the output terminal of the SRAM block 10 to the side of the logic circuitry 40. The controller 52 also inputs a Low signal to the select terminals (SEL) of the multiplexers arranged at the input terminals of the SRAM block 10 in order to select the signals from the logic circuitry 40. The controller 52 further sends a completion signal to the logic circuitry 40. Thereby, the logic circuitry 40 starts to operate by utilizing the non-volatile data written in the different SRAM cells.

In the exemplary method described above, the non-volatile data stored in the SRAM cells in a predetermined block, which is designated by the predetermined range of addresses, is read and copied in the SRAM cells in the different predetermined range of addresses. Accordingly, the addresses of the SRAM cells, from which the non-volatile data is read and to which the data is copied, are not input from the outside of the integrated circuit. Rather, the address generation circuit 56 that generates the predetermined addresses is incorporated within the control circuit 50.

In various exemplary embodiments of semiconductor integrated circuits and methods of operating semiconductor integrated circuits according to this invention, non-volatile data can be stored in a SRAM block, which is integrated in a logic semiconductor integrated circuit as a standard block. Specifically, as shown in FIG. 1, a portion of the SRAM block 10 that is integrated in a logic semiconductor integrated circuit as a standard block is used to store the non-volatile data. Furthermore, the peripheral circuit, such as the read/write circuit 12 and the word line driver 13, are used in common for storing both the volatile and the non-volatile data. Accordingly, it is possible to minimize the increase of the area of the semiconductor integrated circuit.

In different applications, such as for storing the die-ID, however, it is also possible to provide a SRAM block exclusively for storing the non-volatile data. In that case, in order to improve the efficiency of designing the integrated circuit, it is advantageous to prepare a macro cell for storing non-volatile data. Such a macro cell may include a number of SRAM cells, peripheral circuits, and the non-volatile data storage control circuit such as shown in FIG. 5. The macro cell may be commonly used in different semiconductor integrated circuits.

If a SRAM block is provided exclusively for storing the non-volatile data, it is not always necessary to two-dimensionally arrange the SRAM cells as shown in FIG. 1. Depending on the number of necessary SRAM cells to be arranged, it may be possible to arrange them in only one row, for example. Even in that case, the SRAM cells and the peripheral circuits described above developed for the standard SRAM for storing volatile data may be used for providing the SRAM block for storing non-volatile data. Thereby, the efficiency of the design is improved.

What is claimed is:

1. A method of operating a semiconductor integrated circuit including a SRAM block comprising:
 a plurality of flip-flop type SRAM cells each including a pair of output nodes and a pair of pull-down transistors that pull down respective output nodes;
 power supply lines for supplying power-supply potentials to the plurality of SRAM cells; and
 bit lines and word lines for writing volatile data into and reading the volatile data from the plurality of SRAM cells,
 the method comprising:
  storing non-volatile data in at least one of the plurality of SRAM cells by flowing a drain current in one of the pair of pull-down transistors of the at least one of the plurality of SRAM cells; and
  stopping and re-starting to supply the power-supply potentials to the plurality of SRAM cells, and then reading the non-volatile data stored in the at least one of the SRAM cells.

2. The method according to claim 1, wherein:
the at least one of the SRAM cells has a mismatch in the conductance between the pair of pull-down transistors within a range before the storing; and
the flowing of the drain current in the one of the pair of pull-down transistors is performed such that the conductance of the one of the pair of pull-down transistors changes in an amount larger than the range of the mismatch.

3. The method according to claim 1, wherein the flowing of the drain current in the one of the pair of pull-down transistors is performed while supplying a fixed potential to sources of the pair of pull-down transistors.

4. The method according to claim 1, further comprising, after the reading of the non-volatile data, writing the read data into at least another one of the plurality of SRAM cells.

5. The method according to claim 1, wherein the flowing of the drain current includes repeatedly flowing a transient drain current in the one of the pull-down transistors.

6. The method according to claim 1, wherein the flowing of the drain current includes flowing a continuous drain current in the one of the pull-down transistors.

7. A semiconductor integrated circuit comprising:
a SRAM block comprising:
a plurality of flip-flop type SRAM cells each including a pair of output nodes and a pair of pull-down transistors that pull down respective output nodes;
power supply lines for supplying power-supply potentials to the plurality of SRAM cells;
bit lines and word lines for writing volatile data into and reading the volatile data from the plurality of SRAM cells; and
a non-volatile data storage control circuit that controls the SRAM block to store non-volatile data in at least one of the SRAM cells by flowing a drain current in one of the pair of pull-down transistors of the at least one of the SRAM cells.

8. The semiconductor integrated circuit according to claim 7, wherein the flowing of the drain current includes repeatedly flowing a transient drain current in the one of the pair of pull-down transistors.

9. The semiconductor integrated circuit according to claim 8, wherein the non-volatile data storage control circuit includes a counter that counts a number of the repeated flowing of the transient drain current.

10. The semiconductor integrated circuit according to claim 7, wherein the flowing of the drain current includes flowing a continuous drain current in the one of the pair of pull-down transistors.

11. The semiconductor integrated circuit according to claim 10, wherein the non-volatile data storage control circuit includes a timer that measures a time during which the continuous drain current flowed.

12. The semiconductor integrated circuit according to claim 7, further comprising a non-volatile data copying control circuit that detects a start of supplying the power-supply potentials to the SRAM cells and controls the SRAM block to read the non-volatile data stored in the at least one of the SRAM cells and to write the read data into at least another one of the plurality of SRAM cells.

13. A non-volatile data copying control circuit for integrating in a semiconductor integrated circuit comprising an SRAM block including a plurality of SRAM cells, the control circuit comprising:
a detector that detects a start of supplying the power supply potentials to the SRAM cells; and
a controller that controls the SRAM block to read the non-volatile data stored in at least one of the SRAM cells and to write the read data into at least another one of the SRAM cells.

14. The control circuit according to claim 13, further comprising an address generation circuit that generates first addresses of the at least one of the SRAM cells and second addresses of the at least another one of the SRAM cells.

15. The semiconductor integrated circuit according to claim 12, wherein the non-volatile data copying control circuit further comprises an address generation circuit that generates first addresses of the at least one of the SRAM cells and second addresses of the at least another one of the SRAM cells.

* * * * *